(12) United States Patent
Kodama

(10) Patent No.: US 9,924,620 B2
(45) Date of Patent: Mar. 20, 2018

(54) FLAT CABLE FOR ACTUATORS

(71) Applicant: MEIDENSHA CORPORATION, Tokyo (JP)

(72) Inventor: Akihiko Kodama, Ota (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 15/324,380

(22) PCT Filed: Jun. 17, 2015

(86) PCT No.: PCT/JP2015/067431
§ 371 (c)(1),
(2) Date: Jan. 6, 2017

(87) PCT Pub. No.: WO2016/006401
PCT Pub. Date: Jan. 14, 2016

(65) Prior Publication Data
US 2017/0208712 A1    Jul. 20, 2017

(30) Foreign Application Priority Data

Jul. 11, 2014    (JP) ................................. 2014-142800

(51) Int. Cl.
| | |
|---|---|
| *H01R 13/514* | (2006.01) |
| *H01R 13/6586* | (2011.01) |
| *H01R 13/6592* | (2011.01) |
| *H05K 9/00* | (2006.01) |

(Continued)

(52) U.S. Cl.
CPC ......... *H05K 9/0098* (2013.01); *H01B 7/0823* (2013.01); *H01R 12/77* (2013.01); *H01R 27/02* (2013.01)

(58) Field of Classification Search
CPC .......... H01R 13/514; H01R 13/6586–13/6589; H01R 13/6592; H01R 13/658; H01R 23/688; H01R 23/7073; H01R 23/662
USPC ..... 439/607.05–607.07, 607.41–607.52, 497
See application file for complete search history.

(56) References Cited

U.S. PATENT DOCUMENTS

| | | | | |
|---|---|---|---|---|
| 3,173,734 | A | * | 3/1965 | Hartwell ................ H01R 13/28 439/248 |
| 5,007,858 | A | * | 4/1991 | Daly .................... H01R 23/661 439/291 |

(Continued)

FOREIGN PATENT DOCUMENTS

| | | |
|---|---|---|
| JP | 3-43211 U | 4/1991 |
| JP | 6-333436 A | 12/1994 |

(Continued)

OTHER PUBLICATIONS

Korean Office Action, dated Feb. 28, 2017, 5 pages.

*Primary Examiner* — Gary Paumen
(74) *Attorney, Agent, or Firm* — Foley & Lardner LLP

(57) ABSTRACT

Considering a case that a device requiring electric power is arranged in a room where an actuator such as an automatic driving device is disposed, a power cable, a control signal cable, and an electric power cable for the actuator are arranged in parallel and extended in one direction, and thereby a flat part is formed. In a cable side connector provided at both ends of the flat part, a connection terminal of the control signal cable is held at a position where a connection terminal of the electric power cable is put between the connection terminal and a connection terminal of the power cable.

16 Claims, 4 Drawing Sheets

(51) Int. Cl.
*H01B 7/08* (2006.01)
*H01R 27/02* (2006.01)
*H01R 12/77* (2011.01)

(56) References Cited

U.S. PATENT DOCUMENTS

| | | | | |
|---|---|---|---|---|
| 5,312,268 A * | 5/1994 | Sumida | ............... | H01R 13/631 |
| | | | | 439/364 |
| 5,328,388 A * | 7/1994 | Fust | ..................... | H01R 13/514 |
| | | | | 439/364 |
| 5,480,322 A * | 1/1996 | Ishii | ................... | H01R 13/6215 |
| | | | | 439/364 |
| 5,567,182 A * | 10/1996 | Ishii | ..................... | H01R 13/514 |
| | | | | 439/364 |
| 5,788,529 A * | 8/1998 | Borzi | ................... | H01R 9/2458 |
| | | | | 29/830 |
| 5,842,975 A * | 12/1998 | Illyes | ....................... | A61B 5/02 |
| | | | | 439/909 |
| 5,857,863 A * | 1/1999 | Onizuka | ............... | B60K 37/02 |
| | | | | 439/248 |
| 6,010,341 A * | 1/2000 | Matsuoka | ............ | H01R 13/518 |
| | | | | 439/364 |
| 6,027,360 A * | 2/2000 | Jenkins | .............. | H01R 13/6215 |
| | | | | 439/248 |
| 6,152,758 A * | 11/2000 | Matsuoka | .......... | H01R 13/6215 |
| | | | | 439/247 |
| 6,368,130 B1 * | 4/2002 | Fukuda | .................. | H01R 13/52 |
| | | | | 439/271 |
| 7,270,562 B1 * | 9/2007 | Trout | ................. | H01R 13/6215 |
| | | | | 439/364 |
| 8,500,487 B2 * | 8/2013 | Morgan | ............. | H01R 13/6595 |
| | | | | 439/607.06 |
| 8,620,471 B2 * | 12/2013 | Turrini | ................ | G05B 19/401 |
| | | | | 439/488 |
| 2004/0002249 A1 * | 1/2004 | Yamada | ............... | H01R 12/714 |
| | | | | 439/364 |
| 2011/0217873 A1 * | 9/2011 | Diab | ...................... | H01R 13/66 |
| | | | | 439/620.01 |
| 2011/0246014 A1 * | 10/2011 | Sauper | ................ | B60L 11/1818 |
| | | | | 701/22 |

FOREIGN PATENT DOCUMENTS

| | | |
|---|---|---|
| JP | 2009-294014 A | 12/2009 |
| JP | 2013-4506 A | 1/2013 |
| KR | 10-2011-0004349 A | 1/2011 |

\* cited by examiner

FLAT CABLE FOR ACTUATORS

TECHNICAL FIELD

The present invention relates to a flat cable for an actuator, for example, a flat cable which is applicable to an actuator of an automatic driving device for a vehicle test system.

BACKGROUND ART

In a system provided with an actuator as a vehicle test system provided with an automatic driving device for testing power performance, etc. of various kinds of vehicles (for example, a passenger car, a truck, etc.), a power cable and a control signal cable for moving the actuator are used. Furthermore, a structure as described in Patent Document 1 is known. In the structure, each of cables is laid so that one end of each cables is connected to the actuator and so that the other end of each cables is connected to a controller of the actuator (for example, in case of a vehicle test system, a controller, etc. relating to a chassis dynamometer, an automatic driving device, etc.), and thereby the actuator is enabled to be moved by a remote operation.

In the power cable, a noise is caused when an output current changes depending on an operation of the actuator. Therefore, in the power cable and the control signal cable, for example, it is considered that influence caused by the noise is suppressed by using a cable which is made to have a shielding function (an electromagnetic shield, etc.) by forming a conductive shielding body on an outer peripheral side of a wire.

In case of using various equipment in addition to the actuator, for example, in case of using equipment for measuring circumstances around the actuator, etc. together (for example, in case of a system in which the actuator is arranged in a vehicle room, measuring instrument which measures circumstances, etc. in the vehicle room is used together and arranged), it is necessary to properly increase the number of the laid cables.

PRIOR ART DOCUMENT

Patent Document

Patent Document 1: Japanese Patent Application Publication 2009-294014

SUMMARY OF THE INVENTION

However, increasing the number of required cables as described above causes an increase of a workload to lay these cables. Furthermore, even if the cable which is made to have the shielding function by forming the conductive shielding body on the outer peripheral side of the wire as described above is used, not a little influence of the noise to the control signal cable may be caused.

It is an object of the present invention to provide the flat cable for the actuator which is capable of further suppressing the influence of the noise to the control signal cable while improving work efficiency of laying the power cable and the control signal cable for working the actuator.

The flat cable for the actuator according to the present invention can be solve the above problem. Specifically, one aspect of the present invention is the flat cable for the actuator laid between the actuator and a controller of the actuator, comprising:

a cable formed by covering an outer peripheral side of at least one covered wire with a conductive shielding body; and a flat part where a plurality of the cables is arranged in parallel and extended in one direction;

the flat part including a power cable, a control signal cable, and an electric power cable for the actuator, the flat part including a cable side connector which houses each of connection terminals of the power cable, the electric power cable, and the control signal cable in at least one of both ends of the flat part, the cable side connector including:

a connector housing having a bottomed hollow columnar partition wall which has an opening and a connector fitting port in an opening side of the bottomed hollow columnar partition wall; and a holding wall holding each of connection terminals extending from a bottom wall side of the bottomed hollow columnar partition wall in a direction of the connector fitting port at each of positions having a predetermined interval, wherein a connection terminal of the control signal cable is held by the holding wall at a position where a connection terminal of the electric power cable is put between the connection terminal of the control signal cable and a connection terminal of the power cable.

The flat part may be formed by arranging the power cable; the control signal cable; the electric power cable; a measurement signal cable for a measuring instrument located in an installing space of the actuator; and a communication cable constructing a network between the installing space of the actuator and the controller; in a parallel. Furthermore, each connection terminal of one side of each of the measurement signal cable and the communication cable may be housed in the cable side connector and held at a position where the connection terminal of the electric power cable is put between the connection terminal of the power cable and each of the measurement signal cable and the communication cable.

Furthermore, the cable side connector may include a conductive shielding member between the connection terminal of the power cable and connection terminals of the other cables. Furthermore, the holding wall may include a plurality of block structures arranged in an internal space of an inside of the bottomed hollow columnar partition wall, wherein an outer peripheral side of each of the block structures includes a conductive shielding member.

Furthermore, the electric power cable in each of the cables in the flat part may be put between the power cable and the other cables. Furthermore, a minor diameter direction size of the flat part may be 10 mm or less. Furthermore, the flat cable may be laid between the actuator installed in a vehicle room and the controller installed outside the vehicle room.

According to the flat cable for the actuator of the present invention, it is capable of further suppressing influence of the noise to the control signal cable while improving work efficiency of laying the power cable and the control signal cable for working the actuator.

BRIEF EXPLANATION OF THE DRAWINGS

FIG. 4A illustrates a cable including three covered wires bound together. FIG. 4B illustrates a cable including three covered wires bound together, where the covered wires have been twisted together. FIG. 4C illustrates a cable including four covered wires.

DESCRIPTION OF THE EMBODIMENTS

Figure 1:
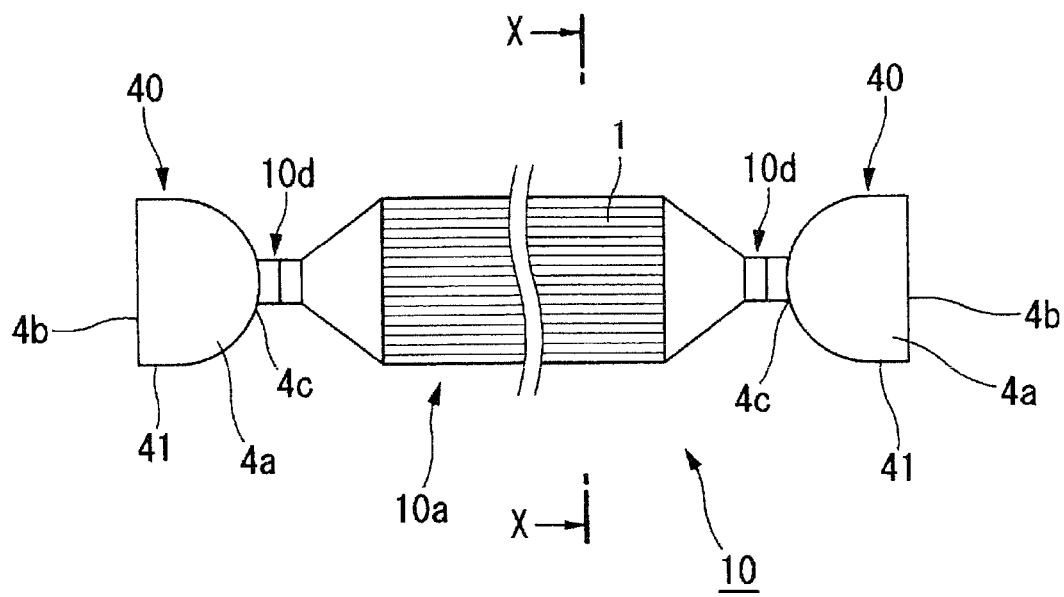
FIG. 1 is a schematic explanation view showing one embodiment of a flat cable for an actuator according to the present invention.

In a flat cable for an actuator according to an embodiment of the present invention (hereinafter, referred to as simply "flat cable"), what is made to have a shielding function by forming a conductive shielding body in an outer peripheral side of a wire in a power cable and a control signal cable of the actuator is not only used. That is, considering case of using a device requiring electric power together besides the actuator (for example, case of installing the actuator and a measuring instrument, etc. in a vehicle room), an electric cable is used besides the above power cable and the above control signal cable, and each of the cables is arranged in parallel and gathered so as to be extended in one direction, and thereby, a flat part is formed. Furthermore, in a cable side connector which is formed in at least one end side of both ends of the flat part, connection terminals of each cables in the one side is not only housed. That is, a connection terminal of the control signal cable is held at a position where a connection terminal of the electric power cable is put between the connection terminal of the control signal cable and a connection terminal of the power cable.

According to the present embodiment, it is possible not only to move the actuator through the power cable and the control signal cable and to supply electric power to the other devices of the actuator through the electric power cable, but also to gather each cables into one flat cable. Thereby, it is possible to improve work efficiency of laying the flat cable. Furthermore, as the connection terminals of each cables are gathered by the cable side connector, to install a counterpart connector which fits the cable side connector in the actuator, etc. in advance can contribute to improving work efficiency of laying the flat cable. Furthermore, as the connection terminal of the control signal cable is held at a position which is far from the connection terminal of the power cable, that contributes to suppressing influence of a noise.

In case that each of the actuator and the controller thereof is disposed on different spaces (for example, the actuator is disposed in a room 11a of a vehicle 11 described above, and the controller is disposed outside the vehicle 11), and that each of the spaces is partitioned by a partition means such as a partition wall, an opening-closing door, if a gap through which the flat cable can pass is formed in the partition means, it is possible to lay the flat cable while passing through the gap.

For example, in a vehicle test system, in case of a structure where the actuator is disposed in the vehicle room, as a general laying structure of the power cable and the control signal cable, a method where a gap corresponding to a radial size of each of the cables (for example, a gap between the window part and a frame part of the window) is formed by moving a window of a vehicle door up and down, and where the cables are passed through the gap of the window and laid has been taken.

Conversely, according to the flat cable having the structure as the present embodiment, in case that the flat cable is laid so that both end faces in a minor diameter direction side of the flat part are put between the vehicle door and a vehicle panel (door opening part), and that the vehicle door is closed, even if a gap between the vehicle door and the vehicle panel is minute, a damage is suppressed because a size in the minor diameter direction of the flat part is small. Thereby, it is possible to substantially maintain a function of the flat cable. That is, according to the above laying of the flat cable, as it is unnecessary to form the gap in the window of the door, the vehicle door is closed. Therefore, the vehicle room is made to be airtight only by closing the window, etc. without an airtight work such as caulking. Thereby, it is possible to conduct a test under an airtight condition.

As mentioned above, even if the actuator can be disposed in the vehicle room and the vehicle room can be made to be airtight, for example, in case that the test is conducted under various environmental conditions (conditions where various phenomena such as temperature, air quantity, rainwater are simulated) with the vehicle disposed in an environmental room, it is possible that an inside of the vehicle room is not affected by the environmental conditions.

Furthermore, in the cable side connector, by constituting a structure where a conductive shielding member is formed between the connection terminal of the power cable in each cables and the connection terminals of the other cables, the cable side connector itself has a shielding function. Thereby, it is possible to further conduce to suppressing the influence of the noise to the control signal cable.

Furthermore, as the flat cable of the present embodiment includes the electric power cable, for example, in the flat part, it may be constituted so that the electric power cable is put between the power cable and the control signal cable. Thereby, as the power cable and the control signal cable are apart from each other in a major diameter direction of the flat cable, it is possible to further conduce to suppressing the influence of the noise to the control signal cable.

As mentioned above, the flat cable according to the present embodiment may have a structure where the flat part is formed by using the electric power cable together with the power cable and the control signal cable, and where in a cable side connector which is formed in at least one end side of both ends of the flat part, the connection terminal of the control signal cable is held at the position where the connection terminal of the electric power cable is put between the connection terminal of the control signal cable and the connection terminal of the power cable. It can be properly changed while using generally known art in various fields such as flat cable field, electric wire field, shielding field, automobile field, chassis dynamo field, and automatic driving device field, and as an embodiment, it is possible to cite the following embodiments.

<An Embodiment of the Flat Cable>

Figure 2:
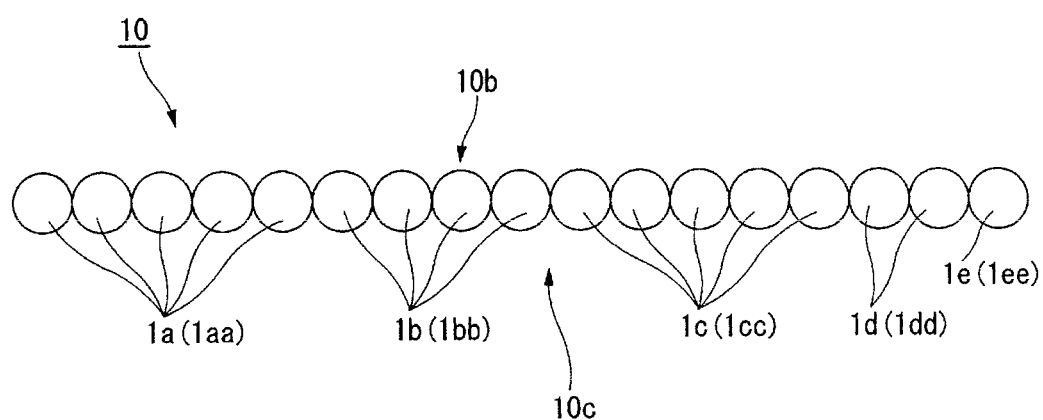
FIG. 2 is a schematic cross-sectional view taken along the line X-X in FIG. 1.
Figure 3:
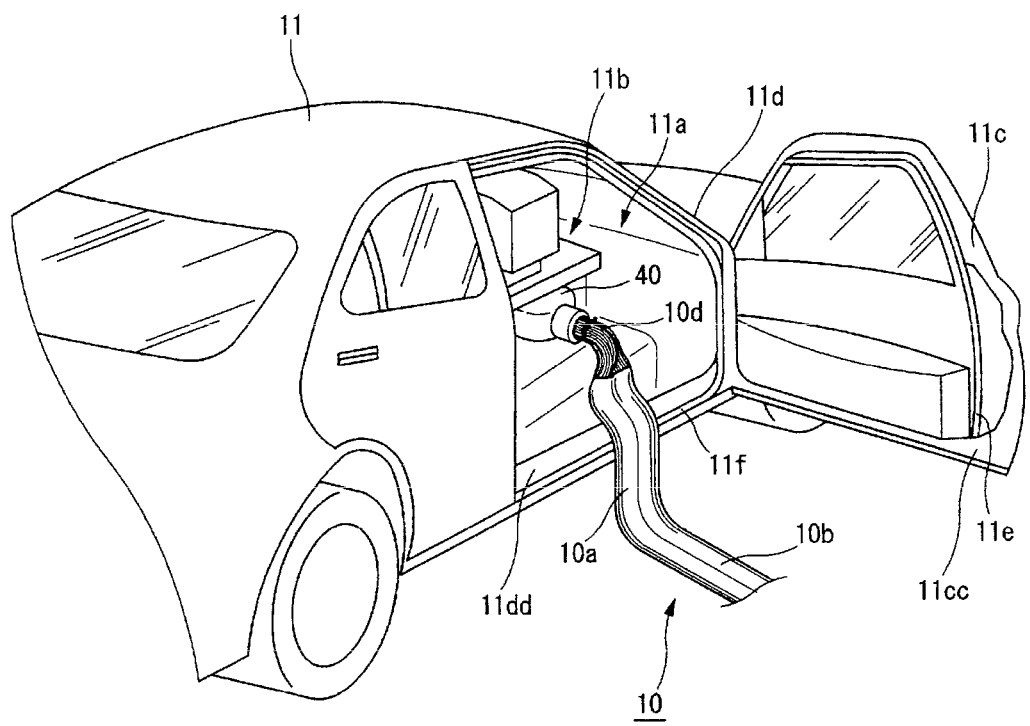
FIG. 3 is a schematic explanation view showing an application embodiment of the flat cable for the actuator according to the present invention.

Reference number 10 shown in FIG. 1 to FIG. 3 indicates one embodiment where the flat cable according to the present embodiment is applied to an automatic driving device of a vehicle test system, and where the flat cable is laid between the actuator disposed in a room 11a of a vehicle 11 and the controller (not shown) disposed outside the vehicle 11. In this flat cable, a plurality of cables 1 (for example, a power cable 1a, an electric power cable 1b, a control signal cable 1c, a measurement signal cable 1d, a communication cable 1e; hereinafter, it is properly called "cable 1".) is arranged in parallel and extended in one direction, and thereby a flat part 10a which has a flat shape is formed in the central part of each cables 1, and it is constituted so as to be laid between the room 11a of the vehicle 11 which is a test object and fixed on a chassis dynamometer (not shown); and the controller disposed outside the vehicle 11 (in FIG. 3, it is laid so that the flat part 10a strides over a lower edge 11dd of the door opening part 11d.).

The cable 1 include at least the power cable 1a, the control signal cable 1c, and the electric power cable 1b. The power cable 1a and the control signal cable 1c relate to the actuator (not shown) of an automatic driving device 11b disposed in the room 11a (for example, on a driver seat). In the cable 1, these cables are arranged in the order of the power cable 1a, the electric cable 1b, and the control signal cable 1c in the major diameter direction of the flat part 10a. Thereby, as particularly shown in FIG. 2, the power cable 1a and the control signal cable 1c are located apart from each other in the major diameter direction of the flat part 10a. Therefore, it is possible to suppress an influence of a noise generated from the power cable 1a to the control signal cable 1c.

The electric power cable 1b can be properly applied to an apparatus requiring electric power in the room 11a. For example, in case that a measuring instrument, etc. (not shown) are disposed in the room 11a, the electric power cable 1b is used in order to provide electric power needed to move the measuring instrument, etc.

Furthermore, in accordance with purposes of use of the flat cable 10, the flat cable 10 may be constituted by adding various cables 1 in addition to the above power cable 1a, electric power cable 1b, and control signal cable 1c. For example, as mentioned above, in case that the measuring instrument, etc. are disposed in the room 11a, the flat cable 10 can be constituted by adding a measurement signal cable 1d for the measuring instrument, etc. Furthermore, in case of constructing a network capable of information communication between the room and the outside of the vehicle 11, it can be constituted by adding a communication cable 1e (for example, a LAN cable) relating to the network.

The number of each cables (the power cable 1a, the electric power cable 1b, the control signal cable 1c, the measurement signal cable 1d, and the communication cable 1e) is not particularly limited, and they can be variously set in accordance with purposes of use of the flat cable 10. For example, the numbers of the power cable 1a and the control signal cable 1c can be properly set, considering each pedaling operation of an accelerator pedal, a clutch pedal, and a brake pedal of the vehicle 11 and a shifting operation and a select operation of a speed change lever relating to a transmission, which are conducted by the actuator of the automatic driving device 11b (in this case, five power cables 1a and five control signal cables 1c are set respectively.).

The number of the electric power cable 1b can be properly set, considering an AC power source (100 V, etc.), a DC power source (24 V, etc.), and the other power sources for a device with the measuring instrument, etc. disposed in the room 11a (in this case, four electric power cables 1b are set.). The number of the measurement signal cable 1d can be properly set, considering measurement of an engine condition by the measuring instrument and measurement relating to the shifting operation and the select operation of the speed change lever (in this case, two measurement signal cables 1d are set.). The number of the communication cable 1e can be set, simply considering construction of a network between an inside of the room and an outside of the vehicle 11 (in this case, one communication cable 1e is set.).

In case that a plurality of each cables 1 is used as mentioned above, for example, as shown in FIG. 2, it can be cited that the flat part 10a is formed so that they are gathered into a power cable group 1aa, an electric cable group 1bb, a control signal cable group 1cc, a measurement signal cable group 1dd, and a communication cable group 1ee respectively and arranged in parallel (in FIG. 2, five power cables 1a, four electric cables 1b, five control signal cables 1c, two measurement signal cables 1d, and one communication cable 1e are respectively arranged in parallel.).

A method for fixing adjacent cables in each cable 1 of the flat part 10a each other is not particularly limited. For example, it can be cited that each adjacent cables are fixed each other by fusing their outer peripheral surfaces together in a major diameter direction of the flat part 10a. Furthermore, in case of covering an outer peripheral side of the flat part 10a with a protective film (not shown) such as a laminate film, the fixing structure of each cable 1 is reinforced as mentioned. Furthermore, according to the above protective film, it is possible to suppress an external damage (for example, external damage caused by laying work) to be possible to occur in the flat part 10a.

In the flat cable 10 constituted as the above, for example, as shown in FIG. 3, it can be cited that it is formed so that the flat cable 10 is laid between the room 11a in a condition where the vehicle door 11c opens (hereinafter, opening condition) and the outside of the vehicle 11, and so that the flat part 10a strides over the lower edge 11dd of the door opening part 11d.

In case of changing from the opening condition which is shown in FIG. 3 to a condition where the vehicle door is closed (hereinafter, closing condition), both end faces 10b, 10c of a minor diameter direction side of the flat part 10a are put between the lower edge 11cc of the vehicle door 11c and the lower edge 11dd of the door opening part 11d (hereinafter, closing condition gap). However, even if the closing condition gap is small or the flat part 10a is pressed by a sealing member such as a weather strip 11e of the vehicle door 11c or a welt body side 11f of the door opening part 11d, it is possible to sufficiently maintain its function while suppressing the damage of the flat cable 10 because of setting a size in a minor diameter direction of the flat part 10a to be small.

The minor diameter direction size of the flat part 10a can be properly set, considering the closing condition gap and the sealing member of the vehicle 11 which is a test object. For example, in case of a vehicle on the market, if the minor diameter direction size is set to be no more than about 10 mm, it can have been found that it is possible to sufficiently maintain its function while suppressing the damage of the flat cable 10 as described above. Furthermore, the major diameter direction size can be properly set as long as a shape of the flat part 10a which is an object can be held in the state where each cable 1 is fixed. Considering laying workability (for example, considering that a worker can do the laying work even with one hand), for example, it can be cited that the major diameter direction size is set to be no more than about 130 mm.

<An Embodiment of Each Cables 1>

In a structure of each cable 1, it is possible to use various structures as long as they can achieve the purpose of use of the above flat cable 10. For example, it is cited to use the cable 1 having structures shown in FIG. 4 (A) to (C) by properly combining them. However, it is preferable to make its appearance good by making the minor diameter direction size uniformly or almost uniformly.

Figure 4:
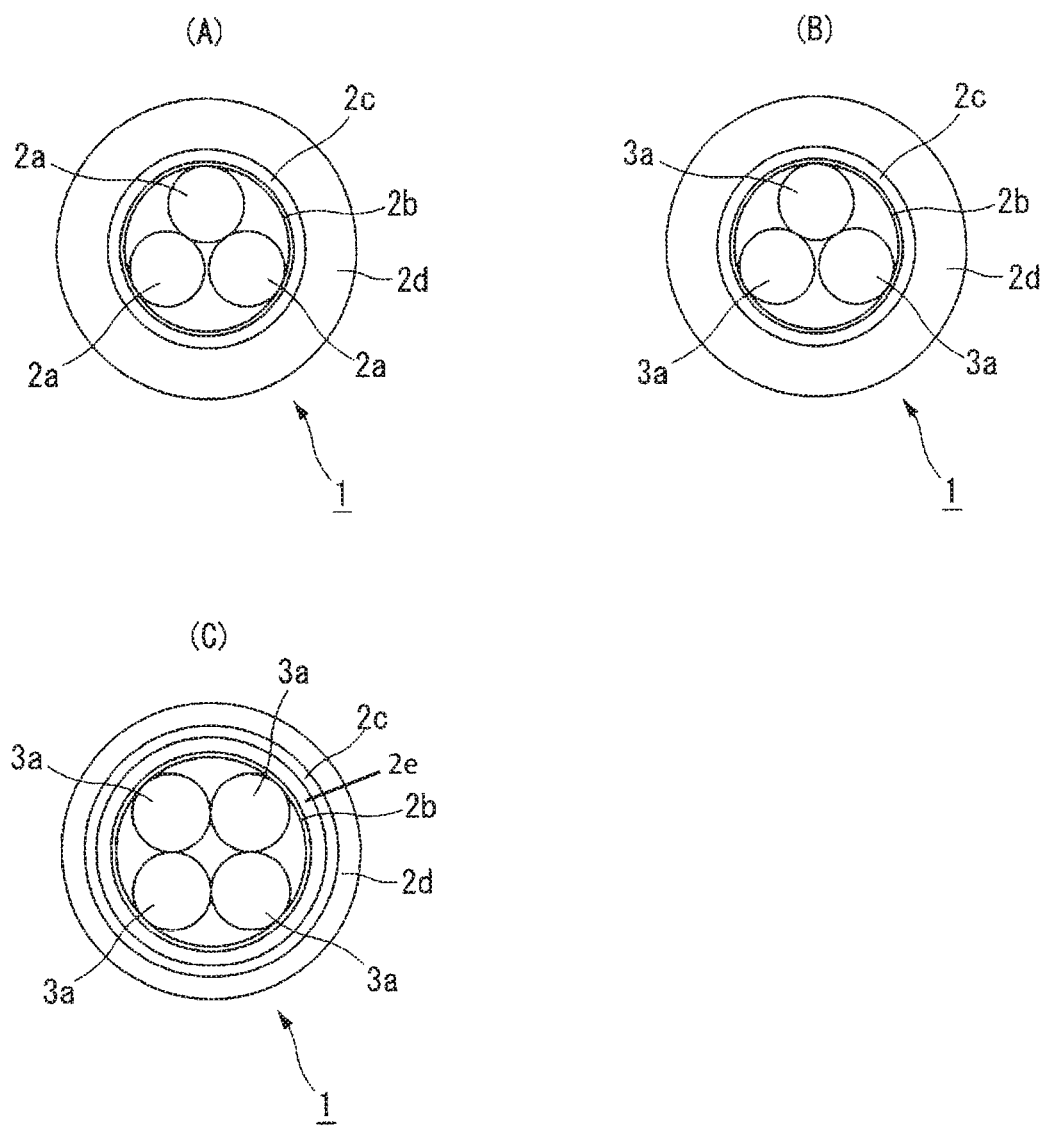
FIG. 4 is a schematic explanation view (schematic cross-sectional view) showing embodiments of various types of the cables used in the flat cable for the actuator according to the present invention.

In the cable 1 in FIG. 4 (A), it is a structure provided with three covered wires 2a where each outer peripheral side of a conductive core wire (a core wire which is made of a conductive metal material such as copper, copper alloy, or the like, and which has a wire shape or a stranded wire shape) is covered with a covering member made of an insulating resin (for example, ethylenetetrafluoroethylene, etc.), etc. Each covered wires 2a is extended in one direction and bound each other, and theirs outer peripheral sides are wound by a wrapping tape member 2b which is made of a resin material (for example, polytetrafluoroethylene, etc.), etc. An outer peripheral side of the wrapping tape member 2b is covered with a shielding body 2c which is made of a conductive material (for example, a metal material such as copper, copper alloy, or the like). Furthermore, an outer peripheral side of the shielding body 2c is covered with a sheath 2d which is made of an insulating resin (for example, polyurethane, etc.), etc. Thereby, the cable 1 in FIG. 4 (A) is structured.

In the cable 1 in FIG. 4 (B), although it has a same structure as the cable 1 shown in FIG. 4 (A), the structure is provided with three covered wires 3a where an outer peripheral side of a core wire formed by twisting a plurality of core wire members is covered with the covering member such as the insulating resin, etc. In the cable 1 in FIG. 4 (C), it has a same structure as the cable 1 shown in FIG. 4 (A). However, the structure is provided with four covered wires 3a, and a middle layer (jacket) 2e which is made of the insulating resin (polyvinyl chloride, etc.), etc. is interposed between the wrapping tape member 2b and the shielding body 2c therein. Furthermore, in case of forming a gap in the inside of each cables 1 shown in FIG. 4 (A) to (C), a filling material (for example, polytetrafluoroethylene, etc.) may be properly filled with the gap.

According to the flat cable 10 using the cable 1 having the structures shown in FIG. 4 (A) to (C), as each cables 1 has a shielding function by including the shielding body 2c, under a condition having possibility of occurring influence by a noise from each cables 1 to the outer peripheral side of the cable 1 or under a condition having possibility of occurring influence by a noise from the outer peripheral side of each cable 1 to the cable 1, the noise is absorbed into the shielding body 2c, and grounded through the shielding body 2c (specifically, grounded by a structure electrically connecting one end side of the shielding body 2c to a prescribed position (for example, ground circuit, etc.)).

In case of one embodiment of the flat cable 10 where the power cable group 1aa, the electric cable group 1bb, the control signal cable group 1cc, the measurement signal cable group 1dd, and the communication cable group 1ee are constituted as shown in FIG. 2, it can be cited that the structure of FIG. 4 (A) is used to the power cable 1a and the electric power cable 1b, the structure of FIG. 4 (B) is used to the control signal cable 1c and the measurement signal cable 1d, and the structure of FIG. 4 (C) is used to the communication cable 1e.

<An Embodiment of the Cable Side Connector>

Figure 5:
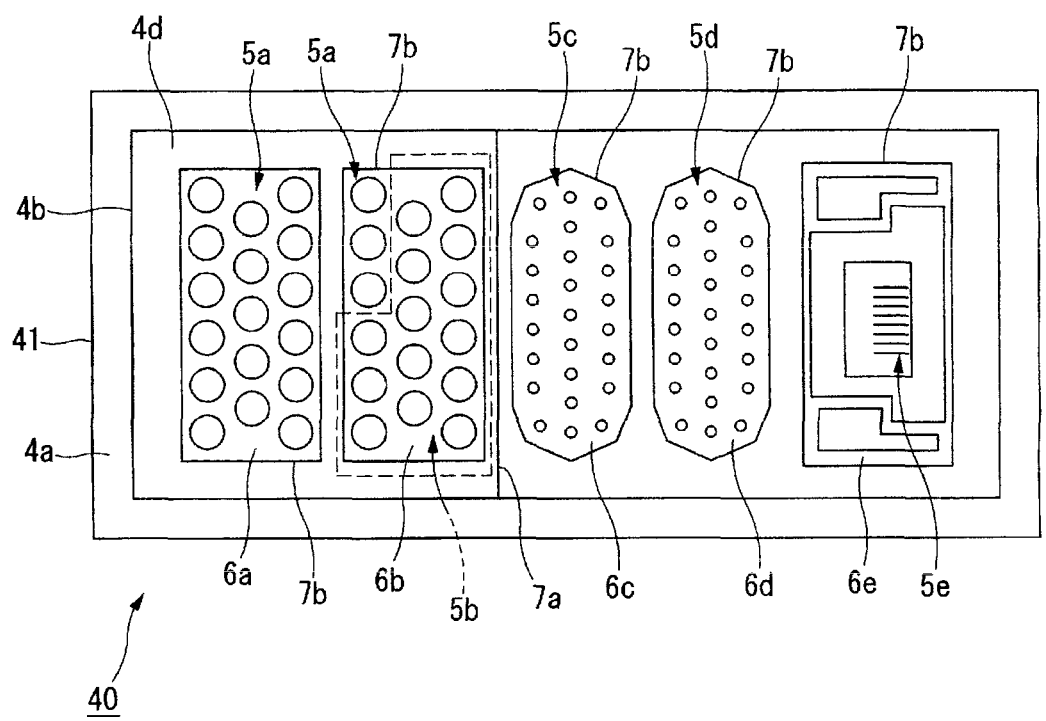
FIG. 5 is a schematic explanation view (a schematic view when seeing the inside of a bottomed hollow columnar partition wall 4a from a connector fitting port 4b side) showing one embodiment of a cable side connector.

In both ends in a longitudinal direction of the flat part 10a, as shown in FIG. 1, FIG. 3, and FIG. 5, a cable side connector 40, which has a connector housing 41 and a holding wall, is installed. The connector housing 41 has a bottomed hollow columnar partition wall 4a which houses connection terminals (for example, each of connection terminals of the power cable 1a, the electric power cable 1b, the control signal cable 1c, the measurement signal cable 1d, and the communication cable 1e, that is, connection terminals 5a, 5b, 5c, 5d, 5e, which are described later) disposed in both ends of each cables 1. Furthermore, a connector fitting port 4b is formed in an opening side of the bottomed hollow columnar partition wall 4a. The holding wall holds each of connection terminals extending from a bottom wall 4c side of the bottomed hollow columnar partition wall 4a in a direction of the connector fitting port 4b at each of positions having a predetermined interval (for example, holding walls 6a to 6e are block shaped, described later.). In the cable side connector 40, it can be cited, for example, to make a structure being capable of fitting a counterpart connector (not shown) disposed in the automatic driving device 11b, or to make a structure being capable of fitting a counterpart connector (not shown) disposed in a controller, etc. (for example, the controller of a chassis dynamometer) of a vehicle test system (not shown).

In an installing structure of the above cable side connector 40, it is not particularly limited. However, as shown in FIG. 1 and FIG. 3, a structure where a bundling part 10d is formed between the flat part 10a and the connection terminals (for example, the connection terminals 5a to 5e in FIG. 5) by bundling each cables 1, and where the bundling part 10d is installed so as to pass through from the bottom wall 4c side of the cable side connector 40 in a direction of the connector fitting port 4b can be cited.

The structure where each of connection terminals is held by the holding wall as described above is not particularly limited. For example, as shown in FIG. 5, it may be a structure where each connection terminals 5c, 5d, and 5e of the control signal cable 1c, the measurement signal cable 1d, and the communication cable 1e can be held at a position where a connection terminal 5b of the electric power cable 1d is put between a connection terminal 5a of the power cable 1a and each connection terminals 5c, 5d, and 5e, while applying a structure (For example, a structure using Han-Eco series produced by HARTING K.K.) including holding walls 6a to 6e which are composed of a plurality of block structural bodies arranged in an internal space 4d of the bottomed hollow columnar partition wall 4a (arranged in parallel in FIG. 5). According such a holding structure, each connection terminals 5c, 5d, and 5e and the connection terminal 5a are located apart from each other (in FIG. 5, they are apart from each other in a direction where the holding walls 6a to 6e arranged in parallel). Therefore, it is possible to suppress an influence of a noise generated from the connection terminal 5a to each connection terminals 5c, 5d, and 5e.

The shapes and the numbers of the holding walls 6a to 6e are also particularly limited. If the holding walls can hold each connection terminals 5c, 5d, and 5e and the connection terminal 5a at the position where they are apart from each other and hold them without a short circuit in each connection terminals 5a to 5e, they may be properly configured. For example, as shown in FIG. 5, in the holding wall 6b, it may be constituted so that the connection terminal 5b of the power cable 1b is held in an area surrounded by dotted lines in the holding wall 6b, and so that the connection terminal 5a of the power cable 1a is held (a part of each connection terminal 5a is held) in a part other than the above area. As a way for suppressing a short circuit in each of connection terminals 5a to 5e as mentioned above, it is cited that an insulating resin material, etc. is used in the holding walls 6a to 6e (for example, the outer peripheral sides of the connection terminals 5a to 5e are covered with the insulting resin, etc.).

Furthermore, a shielding member (shield; for example, shielding members 7a, 7b described later) made of a conductive material, etc. (for example, a conductive metal material such as copper, copper alloy) may be interposed between each connection terminals 5c, 5d, and 5e and the connection terminal 5a. According to such a cable side connector 40 including the shielding member, the cable side connector 40 itself has a shielding function. Therefore, as mentioned above, it is possible to absorb and ground a noise generated from the connection terminal 5a by the shielding member (to ground by a structure that one end side of the shielding member is electrically connected to a prescribed position (for example, ground circuit, etc.)), and thereby it is possible to contribute to suppressing an influence of the noise to each connection terminals 5c, 5d, and 5e. In regard to the shape of the shielding member of the cable side connector 40, for example, as shown in FIG. 5, it is cited that the shape is formed like the shielding member 7a having a shape extending in an axial direction so as to partition the inner space of the bottomed hollow columnar partition wall 4a or like the shielding member 7b having a shape covering the outer peripheral sides of the holding walls 6a to 6e. However, it has the shape being capable of suppressing the influence by the noise as described above, and in that case, it can be properly configured.

Furthermore, in regard to the shapes of the connection terminals 5a to 5e, if it is what the holding walls 6a to 6e can hold, it can be properly used. For example, various male terminals and female terminals, etc. can be used.

Although only the embodiment described above in the present invention has been explained in detail, it is obvious for a person skilled in the art that modifications and variations of the embodiment can be possible within a scope of technical idea of the present invention. It is right that these modifications and variations are included in the scope of the claims.

The invention claimed is:

1. A flat cable for an actuator configured to be laid between the actuator and a controller of the actuator, comprising:
    a plurality of cables comprising at least one covered wire, an outer peripheral side of the at least one covered wire being covered with a conductive shielding body;
    a flat part where the plurality of cables are arranged in parallel and extended in one direction, the flat part including
        a power cable for the actuator,
        a control signal cable for the actuator, and
        an electric power cable for a device other than the actuator; and
    a cable side connector which houses connection terminals of the power cable, the electric power cable, and the control signal cable in at least one end of the plurality of cables,
    wherein the cable side connector includes:
        a connector housing having a bottomed hollow columnar partition wall which has an opening, and a connector fitting port in an opening side of the bottomed hollow columnar partition wall; and
        a holding wall holding connection terminals extending from a bottom wall side of the bottomed hollow columnar partition wall in a direction of the connector fitting port at positions having a predetermined interval between connection terminals,
    wherein a connection terminal of the control signal cable is held by a holding wall at a position where a connection terminal of the electric power cable is positioned between the connection terminal of the control signal cable and a connection terminal of the power cable.

2. The flat cable for the actuator as claimed in claim 1, wherein the flat part is formed by arranging the power cable, the control signal cable, the electric power cable, a measurement signal cable for a measuring instrument located in an installing space of the actuator, and a communication cable constructing a network between the installing space of the actuator and the controller, in parallel.

3. The flat cable for the actuator as claimed in claim 2, wherein each connection terminal of one side of each of the measurement signal cable and the communication cable is housed in the cable side connector and held at a position where the connection terminal of the electric power cable is positioned between the connection terminal of the power cable and each of the measurement signal cable and the communication cable.

4. The flat cable for the actuator as claimed in claim 1, wherein the cable side connector includes a conductive shielding member between the connection terminal of the power cable and the connection terminals of other cables.

5. The flat cable for the actuator as claimed in claim 1, wherein in the flat part, the electric power cable is positioned between the power cable and other cables.

6. The flat cable for the actuator as claimed in claim 1, further comprising a plurality of holding walls, each holding wall configured to hold connection terminals of at least one of the power cable, the control signal cable, or the electric power cable.

7. The flat cable for the actuator as claimed in claim 6, wherein each of the holding walls is spaced apart from an adjacent holding wall by a predetermined distance.

8. The flat cable for the actuator as claimed in claim 6, wherein at least one holding wall is configured to hold connection terminals of the power cable and the electric power cable.

9. The flat cable for the actuator as claimed in claim 1, wherein the at least one covered wire comprises a core wire made of a conductive metal material covered with an insulating resin.

10. The flat cable for the actuator as claimed in claim 1, wherein the plurality of cables comprises a plurality of power cables arranged in parallel in a first group, a plurality of control signal cables arranged in parallel in a second group, and a plurality of electric power cables arranged in parallel in a third group.

11. The flat cable for the actuator as claimed in claim 10, wherein the third group is positioned between the first group and the second group.

12. A flat cable for an actuator configured to be laid between the actuator and a controller of the actuator, comprising:
    a plurality of cables comprising at least one covered wire, an outer peripheral side of the at least one covered wire being covered with a conductive shielding body;
    a flat part where the plurality of cables are arranged in parallel and extended in one direction, the flat part including
        a power cable for the actuator,
        a control signal cable for the actuator, and
        an electric power cable for a device other than the actuator; and
    a cable side connector which houses connection terminals of the power cable, the electric power cable, and the control signal cable in at least one end of the plurality of cables,
    wherein the cable side connector includes:
        a connector housing having a bottomed hollow columnar partition wall which has an opening, and a connector fitting port in an opening side of the bottomed hollow columnar partition wall; and a holding wall holding connection terminals extending from a bottom wall side of the bottomed hollow columnar partition wall in a direction of the connector fitting port at positions having a predetermined interval between connection terminals, wherein a connection terminal of the control signal cable is held by a holding wall at a position where a connection terminal of the electric power cable is positioned between the connection terminal of the control signal cable and a connection terminal of the power cable, wherein the holding wall includes a plurality of block structures arranged in an internal space of the bottomed hollow columnar partition wall, and wherein an outer peripheral side of each of the block structures includes a conductive shielding member.

13. The flat cable for the actuator as claimed in claim 12, wherein the flat part is formed by arranging the power cable, the control signal cable, the electric power cable, a measurement signal cable for a measuring instrument located in an installing space of the actuator, and a communication cable constructing a network between the installing space of the actuator and the controller, in parallel.

14. The flat cable for the actuator as claimed in claim 13, wherein each connection terminal of one side of each of the measurement signal cable and the communication cable is housed in the cable side connector and held at a position where the connection terminal of the electric power cable is positioned between the connection terminal of the power cable and each of the measurement signal cable and the communication cable.

15. The flat cable for the actuator as claimed in claim 12, wherein the cable side connector includes a conductive shielding member between the connection terminal of the power cable and the connection terminals of other cables.

16. The flat cable for the actuator as claimed in claim 12, wherein in the flat part, the electric power cable is positioned between the power cable and other cables.

* * * * *